(12) United States Patent
Aziz et al.

(10) Patent No.: US 8,908,816 B2
(45) Date of Patent: Dec. 9, 2014

(54) RECEIVER WITH DISTORTION COMPENSATION CIRCUIT

(71) Applicant: LSI Corporation, Milpitas, CA (US)

(72) Inventors: Pervez M. Aziz, Dallas, TX (US); Hiroshi Kimura, San Jose, CA (US)

(73) Assignee: LSI Corporation, San Jose, CA (US)

( * ) Notice: Subject to any disclaimer, the term of this patent is extended or adjusted under 35 U.S.C. 154(b) by 141 days.

(21) Appl. No.: 13/719,954

(22) Filed: Dec. 19, 2012

(65) Prior Publication Data

US 2014/0169426 A1   Jun. 19, 2014

(51) Int. Cl.
| H03D 1/04 | (2006.01) |
| H03D 1/06 | (2006.01) |
| H03K 5/01 | (2006.01) |
| H03K 6/04 | (2006.01) |
| H04B 1/10 | (2006.01) |
| H04L 1/00 | (2006.01) |
| H04L 25/08 | (2006.01) |
| H04L 25/03 | (2006.01) |

(52) U.S. Cl.
CPC ..................................... *H04L 25/03* (2013.01)
USPC .......................................................... 375/346

(58) Field of Classification Search
None
See application file for complete search history.

(56) References Cited

U.S. PATENT DOCUMENTS

| 5,079,515 | A | 1/1992 | Tanimoto |
| 5,258,722 | A | 11/1993 | Jeffers |
| 6,385,436 | B1 * | 5/2002 | Horiguchi et al. ........... 455/63.1 |
| 6,788,140 | B2 | 9/2004 | Cameron et al. |
| 2003/0016741 | A1 * | 1/2003 | Sasson et al. ................. 375/229 |
| 2004/0164791 | A1 * | 8/2004 | Batruni ......................... 327/552 |
| 2006/0251195 | A1 * | 11/2006 | Chen et al. .................... 375/348 |

OTHER PUBLICATIONS

Lim et al., A CMOS Cubic Voltage Generator for a Tempeture Compensated Crystal Oscillator (TCXO), 2008, IEEE.*
Lee C. Thomas; Eliminating Broadband Distortion in Transistor Amplifiers; The Bell System Technical Journal; Mar. 1968.
Barrie Gilbert; The Multi-tanh Principle: A Tutorial Overview; IEEE Journal of Solid-State Circuits, vol. 33, No. 1, Jan. 1998.
Jingyu Hu; Design and Implementation of a Novel Low Noise Low Distortion Frequency Modulation Radio Receiver Front-End; Dissertation presented to the University of Texas at Austin; May 2007.

* cited by examiner

*Primary Examiner* — Chieh M Fan
*Assistant Examiner* — Wednel Cadeau
(74) *Attorney, Agent, or Firm* — Suiter Swantz pc llo (57) ABSTRACT

A receiver containing analog circuitry that generates distortion, a distortion compensation circuit coupled to an output of the analog circuitry, and a slicer, operating as a signal peak detector, coupled to the distortion compensation circuitry. The distortion compensation circuit has a subtractor, a function generator, and a weighting circuit. The subtractor has a first input coupled to the output of the analog circuitry, a second input, and an output. The function generator has an input coupled to the first input of the subtractor. The weighting circuit, responsive to a weighting coefficient, is coupled between an output of the function circuit and the second input of the first subtractor. The function generator has a transfer function with a third-power term and the weighting coefficient is set to a value based on the level of the signal peaks that will least partially reduce distortion in signals on the output of the subtractor.

20 Claims, 4 Drawing Sheets

RECEIVER WITH DISTORTION COMPENSATION CIRCUIT

FIELD OF THE INVENTION

The present invention relates to receivers generally and, more specifically, to receivers having analog equalizers therein.

BACKGROUND

Communication receivers that recover digital signals must sample an analog waveform and then reliably detect the sampled data. Signals arriving at a receiver are typically corrupted by intersymbol interference (ISI), crosstalk, echo, and other noise. As data rates increase, the receiver must both equalize the channel, to compensate for such corruptions, and detect the encoded signals at increasingly higher clock rates. Decision-feedback equalization (DFE) is a widely used technique for removing intersymbol interference and other noise at high data rates.

Generally, decision-feedback equalization utilizes a nonlinear equalizer to equalize the channel using a feedback loop based on previously detected (or decided) data. In one typical DFE-based receiver implementation, a received analog signal is sampled after DFE correction and compared to one or more thresholds to generate the detected data.

To improve the performance of DFE-based receiver, the receiver includes an analog front end (AFE) having a variable gain amplifier (VGA), used to control the input signal level, and an equalizer used to compensate for linear, frequency-based distortions in the input signal to the receiver. The equalizer (also referred to herein as a continuous time linear equalizer or CTLE) is generally implemented as an analog-based filter with at least one adjustable coefficient or peaking parameter that can at least partially compensate for linear distortions in the received signal. However, the analog circuitry in the AFE might have inherent limitations, one of which is the amount of nonlinear distortion introduced onto the received signal by various analog circuits in the AFE. Any distortion introduced by the AFE can seriously degrade performance of the overall receiver.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment of the invention, a method of reducing distortion in an amplifier is described. An input signal, having controllable amplitude, is applied to the amplifier to produce an output signal and an intermediate signal is generated that is a function of the output signal. The amplitude of the intermediate signal is scaled by a weighting factor and the weighted intermediate signal is subtracted from the output signal to produce a compensated signal. The output signal is measured to determine the peak amplitude thereof and the amplitude of the input signal is adjusted until a change in the measured peak amplitude is less than a threshold amount. Then the weighting factor is set to a value related to the measured peak amplitude.

BRIEF DESCRIPTION OF THE DRAWINGS

Other embodiments of the present invention will become more fully apparent from the following detailed description, the appended claims, and the accompanying drawings in which like reference numerals identify similar or identical elements.

DETAILED DESCRIPTION

In addition to the patents referred to herein, each of the following patents and patent applications are incorporated herein in their entirety:

U.S. Pat. No. 7,616,686, titled "Method and Apparatus for Generating One or More Clock Signals for a Decision-Feedback Equalizer Using DFE Detected Data", by Aziz et al.

U.S. Pat. No. 7,599,461, titled "Method and Apparatus for Generating One or More Clock Signals for a Decision-Feedback Equalizer Using DFE Detected Data in the Presence of an Adverse Pattern", by Aziz et al.

U.S. Patent Publication 2011-0274154, application Ser. No. 12/776,681, titled "A Compensated Phase Detector for Generating One or More Clock Signals Using DFE Detected Data in a Receiver", by Aziz et al.

U.S. patent application Ser. No. 13/288,096, titled "Low Nonlinear Distortion Variable Gain Amplifier", by Aziz et al.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple", "coupling", "coupled", "connect", "connecting", or "connected" refer to any manner known in the art or later developed in which energy is allowed to transfer between two or more elements, and the interposition of one or more additional elements is contemplated, although not required. Conversely, the terms "directly coupled", "directly connected", etc., imply the absence of such additional elements. Signals and corresponding nodes or ports might be referred to by the same name and are interchangeable for purposes here. The term "or" should be interpreted as inclusive unless stated otherwise. Further, elements in a figure having subscripted reference numbers (e.g., $100_1$, $100_2$, ... $100_K$) might be collectively referred to herein using the reference number 100.

The present invention will be described herein in the context of illustrative embodiments of a distortion compensation circuit adapted for use in a serializer/deserializer or the like. It is to be appreciated, however, that the invention is not limited to the specific apparatus and methods illustratively shown and described herein.

As data rates increase for serializer/deserializer (SERDES) applications, the channel quality degrades. Decision feedback equalization (DFE) in conjunction with an optional finite impulse response (FIR) filter in a transmitter (TX) and a receiver equalizer within a receiver is generally used to achieve the bit error rate (BER) performance needed for reliable communications. It is understood that the FIR function of the transmitter can be moved from the transmitter to the receiver and incorporated into the receiver's analog front end (AFE).

Figure 1:
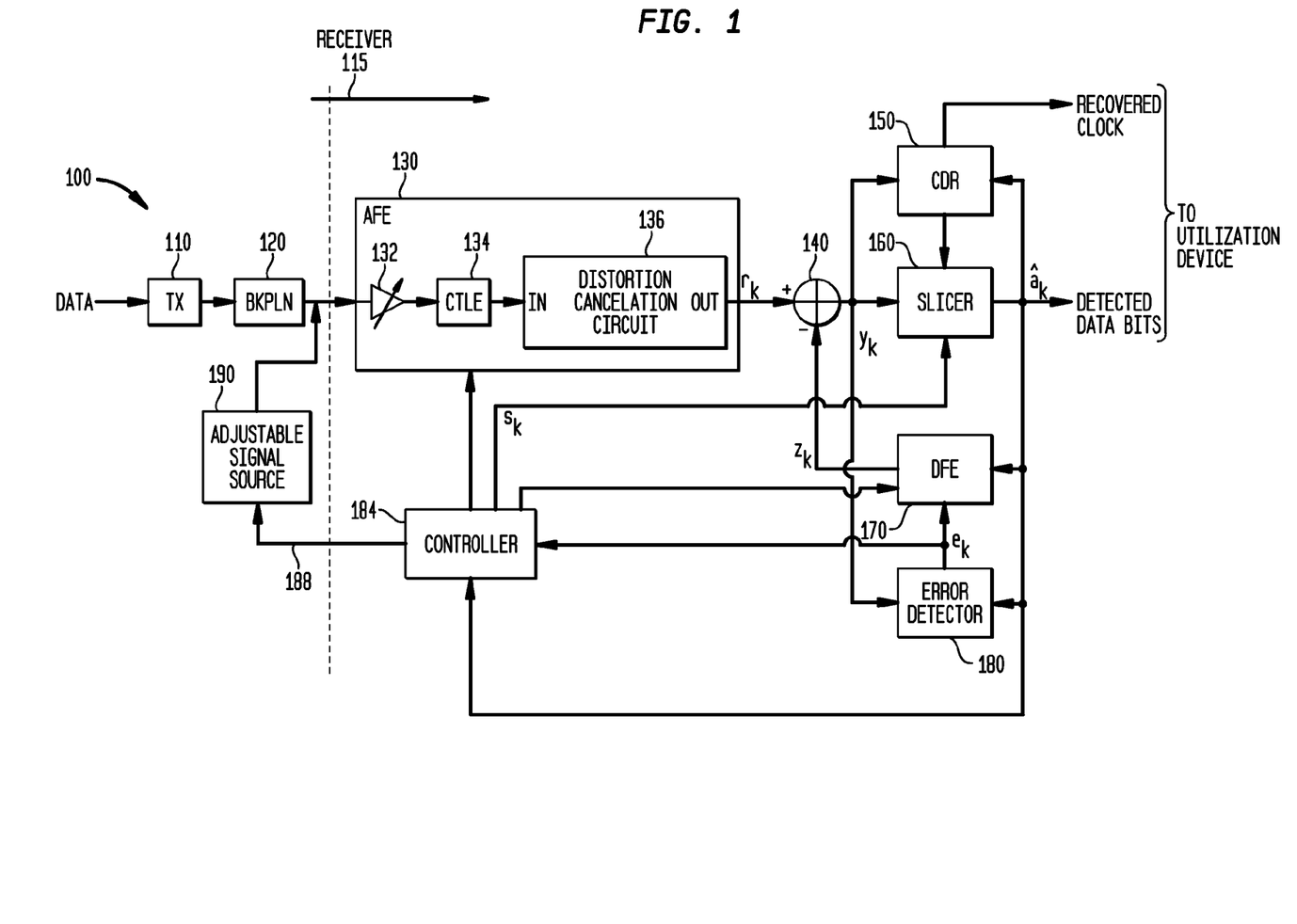
FIG. 1 is a simplified block diagram of a serializer/deserializer (SERDES) communication channel having a receiver incorporating a decision feedback equalizer having an analog front end (AFE) with a distortion compensation circuit.

FIG. 1 is a block diagram of a typical SERDES communication channel 100 that incorporates a traditional DFE-based equalizer in addition to the TX and RX equalization. As shown in FIG. 1, a transmitter 110 transmits data to a receiver 115 through a channel 120 (such as a backplane) after being equalized or filtered by an optional transmit filter (not shown). After passing through the backplane (BKPLN) 120, metal traces in a substrate (not shown), a cable (not shown), or a combination thereof, the analog signal is filtered or equalized by an analog front end (AFE) 130 of receiver 135 having a variable gain amplifier 132 for amplitude control and may include, for example, a continuous-time filter. The analog signal output $r_k$ of the AFE 130 passes through subtractor 140, used in conjunction with a decision feedback equalizer (DFE) 170 having one or more taps and described below, and is then sampled by a clock/data recovery (CDR) circuit 150. A slicer 160 (described below) digitizes the output $y_k$ of the subtractor 140 by comparing the sample to an exemplary threshold setting of zero in response to the data clock generated by the CDR 150 and latches the result.

The phase of the analog waveform is typically unknown and there may be a frequency offset between the frequency at which the original data was transmitted and the nominal receiver sampling clock frequency. The function of the CDR 150 is to properly sample the analog waveform such that when the sampled waveform is passed through a slicer, the data is recovered properly despite the fact that the phase and frequency of the transmitted signal is not known. The CDR 150 may be conventional and is often an adaptive feedback circuit where a feedback loop adjusts the phase and frequency of the nominal clock to produce a modified recovered clock that can sample the analog waveform to allow proper data detection.

Exemplary operation of the DFE 170 in FIG. 1 is well known and explanation of the filter 170 and alternative embodiments thereof may be found in the above-referenced patent application by Aziz et al, titled "A Compensated Phase Detector tor Generating One or More Clock Signals Using DFE Detected Data in a Receiver". For purposes here, a DFE correction, $z_k$, is generated by a DFE filter 170 and is subtracted by an analog subtractor 140 from the output, $r_k$, of the AFE 130 to produce a DFE corrected signal $y_k$, where $y_k = r_k - z_k$. Then the DFE-corrected signal $y_k$ is detected by the slicer 160 to produce the detected data bits $\hat{a}_k$. The error signal $e_k$ from error detector 180 governs the adaptive operation of the taps in the DFE 170, under the control of controller 184.

As will be explained in more detail in connection with FIG. 4, an adjustable signal source 190 might be provided to inject a signal into the AFE 130 during adjustment of a distortion compensation circuit in the AFE 130. When the source 190 is active, the channel 130 is disconnected from the receiver 115. The source 190 might be, in one embodiment, a test set or other calibrated signal source, or might be, in another embodiment, a transmitter similar to transmitter 110 but implemented on the same semiconductor substrate as the receiver 115. The controller 184 controls the signal source 190 via control path 188.

The slicer 160 is conventional and can be implemented as a slicer-latch (i.e., a decision device based on an amplitude threshold and a latch to hold the results of the decision device) or a more complicated detector such as a sequence detector. For high-speed applications, the slicer 160 is often implemented as a slicer-latch that is clocked by a CDR-generated clock. In addition to sampling the data signal, the slicer 160 essentially quantizes the signal to a binary "1" or "−1" based on the sampled analog value and a slicer threshold setting, $s_t$. If the input to the slicer 160 at time k is $y_k$, then the detected data bit output, $\hat{a}_k$ of the slicer 160 is given as follows:

$$\hat{a}_k = +1 \text{ if } y_k > s_t$$
$$= -1 \text{ otherwise.}$$

In this embodiment and when receiving data, the slicer 160 has a slicer threshold setting $s_t$ of zero. In other embodiments, the binary representations of the quantized signal could be reversed, the slicer threshold setting $s_t$ could be nonzero, or the output bits have values of "1" and "0".

As will be discussed in more detail below and in this embodiment, the slicer 160 is also used as a peak detector to detect peaks in the signal from AFE 130. During peak detection, the controller 184 disables DFE 170 so that the output $z_k$ of DFE 170 is approximately zero. In addition and as will be explained in more detail in connection with FIG. 4, the controller 184 adjusts slicer threshold setting $s_t$ to detect a peak in the data eye of the signal from the AFE 130.

In another embodiment, a peak detector (not shown), separate from the slicer 160, might be used to detect peaks in the signal from subtractor 140. In still another embodiment, the peak detector is directly connected from the output of the AFE 130, allowing peak detection without disabling the DFE 170.

The AFE 130, in this embodiment, has a conventional variable gain amplifier (VGA) 132 coupled to the input of the receiver, a conventional continuous time linear equalizer (CTLE) 134 having an input coupled to the output of the VGA, and a distortion compensation circuit 136 having an input IN coupled to the output of the CTLE and an output OUT coupled to the subtractor 140. The VGA 132 is used to adjust the input signal level to the CTLE 134 and subsequent circuitry, and the CTLE 134 is used to compensate for linear, frequency-based distortions in the input signal to the receiver. The CTLE is generally implemented as an analog-based filter with at least one adjustable coefficient or peaking parameter that can at least partially compensate for linear distortions in the received signal. As will be explained in more detail in connection with FIGS. 2 and 3, the distortion compensation circuitry 136 reduces distortion generated by at least the CTLE before the analog signals from the AFE 130 are presented to the subtractor 140 and on to the remainder of the receiver 115.

A conventional error detector 180 takes the difference between the DFE-corrected signal $y_k$ and the detected data bits $\hat{a}_k$ to generate an error signal $e_k$. Alternatively, the error may be detected as a signed quantity using error slicers with appropriate threshold settings as exemplified in "Adaptation Algorithms for a Class of Continuous Time Analog Equalizers With Application to Serial Links", by P. M. Aziz and A V. Malipatil, Proceedings of the 2011 IEEE International Symposium on Circuits and Systems (ISCAS 2011), pp. 1383-1386, included by reference herein in its entirely. The controller 184, responsive to the error signal $e_k$, generates the coefficient control signals for adjusting the gain control settings of the VGA and one or more coefficient parameters of the CTLE 134. During the training or adaptation phase by the receiver 115, the controller 184, responsive to the error signal $e_k$, converges one or more coefficient values of the CTLE 134 either to reduce intersymbol interference during eye openings or to reduce signal transition jitter. An exemplary technique for adapting the VGA and CTLE is described in "Adaptation Algorithms for a Class of Continuous Time Analog Equalizers With Application to Serial Links", by P. M. Aziz and A V. Malipatil, Proceedings of the 2011 IEEE International Symposium on Circuits and Systems (ISCAS 2011), pp. 1383-1386, included by reference herein in its entirely. Alternatively, the CTLE 134 may be manually configured by a user setting the coefficient values for the CTLE 134 or by using predetermined coefficient values.

Figure 2:
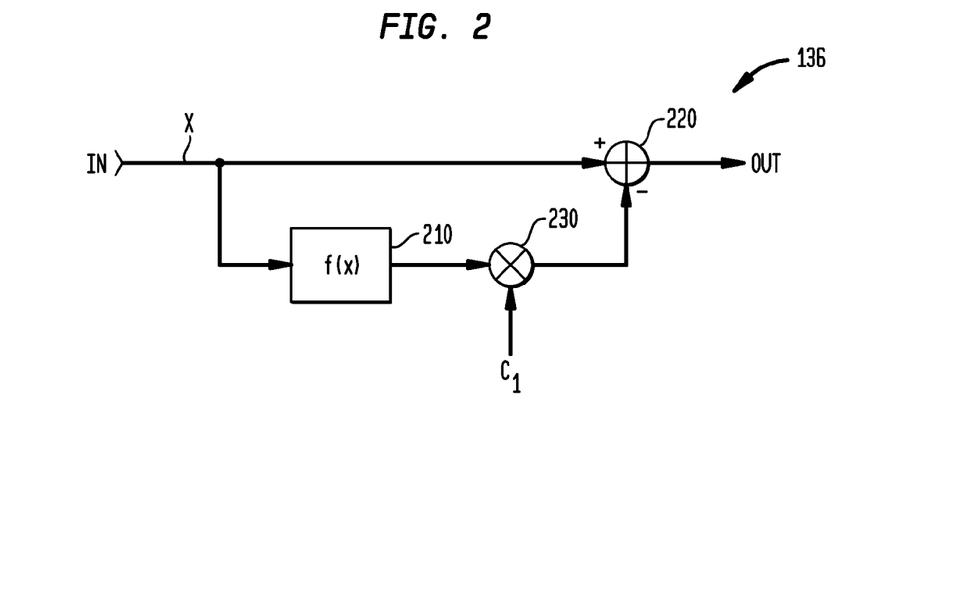
FIG. 2 is a simplified block diagram of an implementation of the distortion compensation circuit shown in FIG. 1.

In FIG. 2, one embodiment of the distortion compensation circuit 136 is illustrated. The input IN is coupled to a function generator 210 and to the non-inverting input of a subtractor 220. Output from the function generator 210 is coupled to a weighting circuit 230, here illustrated, as a multiplier, which is also responsive to a weighting coefficient $C_1$. The output of the weighting circuit 230 is coupled to the inverting input of the subtractor 220, the output of which is the output of the distortion compensation circuit 136. The function generator 210 applies transfer function $f(x)$ to the input signal (here "x") on input IN and the output of the generator 210 is weighted by the weighting factor $C_1$. Thus, the output of the distortion compensation circuit 136 can be written as $x - C_1 f(x)$.

Generally, analog circuits such as the VGA 132 and the CTLE 134 often have a non-linear behavior that can be characterized by a non-linear function such as a hyperbolic tangent (tan h) function:

$$y = A \tan h(x/A)$$

where x is an input signal to the analog circuit, y is the output of the analog circuit, and A is a saturation factor. By using a Taylor expansion of the tan h(x) function, then:

$$y = A(x/A - x^3/3A^3 + 2x^5/15A^5 \ldots), \text{ and thus:}$$

$$y = (x - x^3/3A^2 + 2x^5/15A^4 \ldots).$$

Terms having a power greater than one (e.g., $x^3$, $x^5$, etc.) represent distortion present in the signal from the analog amplifier. Removing the contribution from all of these power terms from the output signal will result in an essentially distortion-free signal but implementing such a technique might be difficult to do. However, by recognizing that the third-order term ($x^3/3A^2$) in the above equation provides the largest distortion contribution of all the terms, cancelation of third-order term from the output of the analog circuit will have a substantial impact in reducing distortion of the analog circuit. Thus, if $f(x)$ in FIG. 2 is $x^3$ and $C_1$ is equal to $\frac{1}{3}A^2$, then the output signal from the circuit 136 has significantly less distortion. Writing $f(x)$ as the function $x^3$, $C_1$ as $\frac{1}{3}A^2$, and the output of the summer 220 is $x - C_1 f(x)$ as described above, then the output of the subtractor 220 can be written as:

$$A \tan h(x/A) - (-\tfrac{1}{3}A^2)(A \tan h(x/A))^3.$$

By rewriting the above equation using the expansion of tan h(x), then:

$$(x - x^3/3A^2 + 2x^5/15A^4 + \ldots) - (-\tfrac{1}{3}A^2)(x - x^3/3A^2 + 2x^5/15A^4 + \ldots)^3.$$

Ignoring terms with x having powers greater than 5, then the above is rewritten as:

$$(x - x^3/3A^2 + 2x^5/15A^4) + ((x^3/3A^2) - (x/3A^2)(x^3/3A^2)),$$

and thus the output of the subtractor 220 (and that of the canceler circuit 130) is approximately:

$$x - x^4/9A^4 + 2x^5/15A^4.$$

Thus, in theory, this circuit results in the cancelation of the third-order distortion term and substitutes a smaller (by a factor of $3A^2$) fourth-order distortion term. However, the overall result is a reduction in the level of distortion in the output of the distortion compensation circuit 130. This reduction in distortion has been found to improve the bit error rate (BER) of the receiver 115 compared to the same receiver without distortion reduction circuit 136.

The saturation factor A is dependent on the analog circuit and is determined by measuring the peak of a signal output from the analog circuit as the circuit begins to saturate. This signal might be a data signal having an eye opening and the peak that is measured is the peak of the eye opening. A process for measuring the saturation factor is described below in connection with FIG. 4.

In another embodiment, one or more additional function generators, weighting circuits, and corresponding weighting factors may be employed, to cancel additional, higher order distortion-generating terms. This additional circuitry (not shown) can be disposed in parallel with the generator 210 and weighting circuit 230 such that the output(s) of the additional weighting circuits are applied as additional inputs to the subtractor 220.

Figure 3:
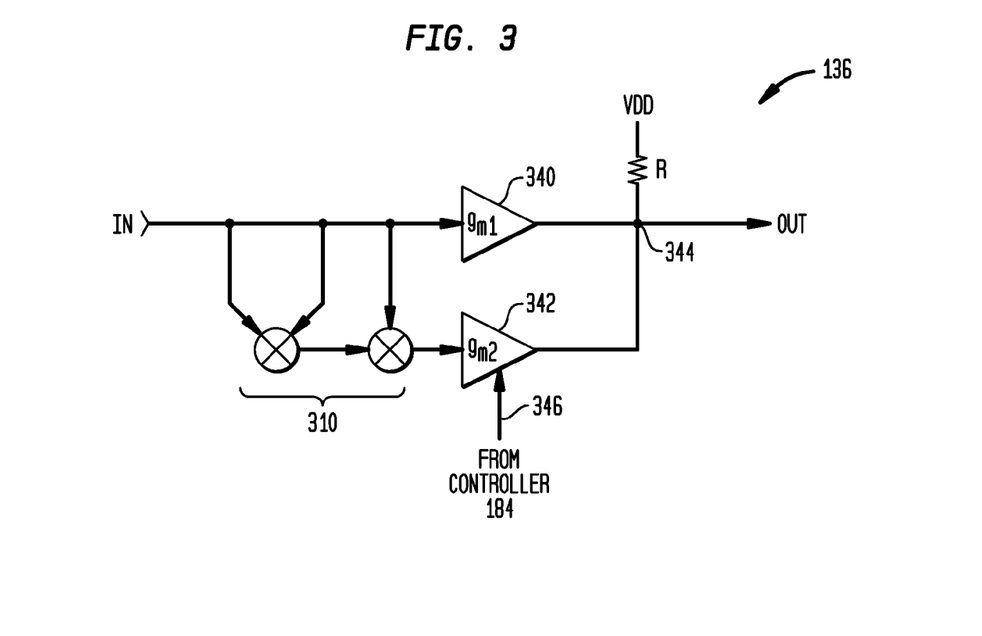
FIG. 3 is a simplified schematic diagram of an embodiment of the distortion compensation circuit of FIG. 2.

In FIG. 3 an exemplary implementation of the distortion compensation circuit 136 is shown using transconductance amplifiers 340, 342. Two multipliers, such as Gilbert multiplier cells, form a cubic generator 310, the output of which is fed to the transconductance amplifier 342 having a transconductance of $g_{m2}$. Output currents from the transconductance amplifier 340 and 342 are summed at node 344 with resistor R as a load.

Assuming that the overall voltage gain of the path of transconductance amplifier 340 is approximately one ($Rg_{m1} \cong 1$), then the voltage gain of the path through the transconductance amplifier 342 is approximately $1/(3A^2)$ ($Rg_{m2} \cong 1/(3A^2)$). The transconductance of the amplifier 342 is set by a bias signal from the controller 184 on bus 346. Alternatively, the ratio of the gain of the amplifier 342 to that of amplifier 340 is set to $1/(3A^2)$.

The controller 184 determines the amount of gain by transconductance amplifier 342 so that $C_1$ is approximately $1/(3A^2)$. In order for the controller 184 to set the gain of amplifier 342, the controller disables DFE 170 (FIG. 1), so that the output $z_k$ of DFE 170 is approximately zero, and configures the slicer 160 to operate as a peak detector to detect peaks in the signal from AFE 130. An exemplary process 400 for setting the gain is illustrated in FIG. 4.

Starting with step 402, the DFE 170 is disabled as described above, and the adaptation loops that adjust the coefficients of the DFE and AFE are also disabled. A signal from variable signal source 190 is applied to the input of the receiver 115/AFE 130 having an initial amplitude V(0), and loop index i initialized, where i is an integer. In one embodiment, the input signal is supplied by a test set or the like or an on-chip transmitter with a known, e.g., calibrated, amplitude. Alternatively, the transmitter 110 supplies the input signal. In both cases, the controller 184 controls the amplitude of the input signal using control path 188. In still another embodiment, the transmitter 110 or the variable signal source 190 supplies a calibrated input signal with fixed amplitude but no control path 188 is required. Instead, the gain of VGA 132, under control of the controller 184, is used to adjust the amplitude of the signal applied to the CTLE 134 provided that the VGA is not a significant source of distortion.

In steps 404-410, the slicer 160 is used to detect the peak of the signals from AFE 130. Because, as described above the output of slicer 160, $â_k$, is +1 if $y_k > s_t$ and −1 if $y_k < s_t$, then for the slicer 160 to detect peaks in the signal from AFE 130, the controller 184 adjusts the slicer threshold setting $s_t$ until the detected data bit output $â_k$ become essentially all −1 for positive peaks. Alternatively or additionally as required, the controller 184 adjusts the slicer threshold setting $s_t$ until the detected data bit output $â_k$ become essentially all +1 for negative peaks. In step 404, the threshold setting $s_t$ of the slicer is initialized, at zero and in step 406, for the next N symbols or for an equivalent period of time, the output of the slicer 160 is sampled to determine in step 408 if all (or substantially all) of the symbols have a value of −1. If not, then control passes to step 410 and the slicer threshold setting is increased by Δs, where Δs is small amount, e.g., a few millivolts. Once all or substantially all of the samples have a value of −1, then $s_t$ is approximately the peak positive voltage of the signals from AFE 130 and variable A(i) is set to $s_t$ in step 412 (on the first pass, i=0). The indexed variable A is used to determine the slope or change in the peak value as the amplitude of input signal is increased. The slope is used in steps 414-420 to determine the level of input signal that results in the onset of compression or saturation of the CTLE amplifiers and hence the value of $C_1$ needed for distortion reduction.

In step 414, if the index i is zero (indicating that only A(0) has been determined in step 412) or if the change in the peak values as determined in steps 404-410 is more than $A_{tol}$, then control passes to step 416 where the index value i is incremented. $A_{tol}$ is a threshold value related to the resolution of the slicer 160. For purposes here, the $A_{tol}$ is somewhat greater than the resolution of the slicer, e.g., $A_{tol}$ is set to 5 mV.

Next, in steps 418 and 420, the amplitude of the input signal (or gain of the VGA 132) is increased by an amount ΔV, where ΔV is dependent on the resolution of the slicer 160 and the increment Δs, e.g., a few millivolts. Then steps 404-420 are repeated until the change in the amplitude in A is less than $A_{tol}$ in step 414 and control passes to step 422. In step 422, the value saturation factor, $A_{sat}$, is set to the last value of the peak amplitude from AFE 130, A(i), and $C_1$ is calculated in step 424 using $A_{sat}$. Then, in step 426, the calculated value $C_1$ is applied to the distortion compensation circuit 136 (FIG. 2). Alternatively and for the embodiment shown in FIG. 3, the processor 184 executes an additional step (not shown) of calculating the transconductance of the amplifier 342 and the bias signal necessary to accomplish this is applied to the amplifier 342 on bus 346. In still another embodiment, the value of $C_1$ and the transconductance of the amplifier 342 is pre-calculated and stored in a table indexed by the value of $A_{sat}$. Then, the DFE and AFE adaptation loops are enabled in step 428.

Figure 4:
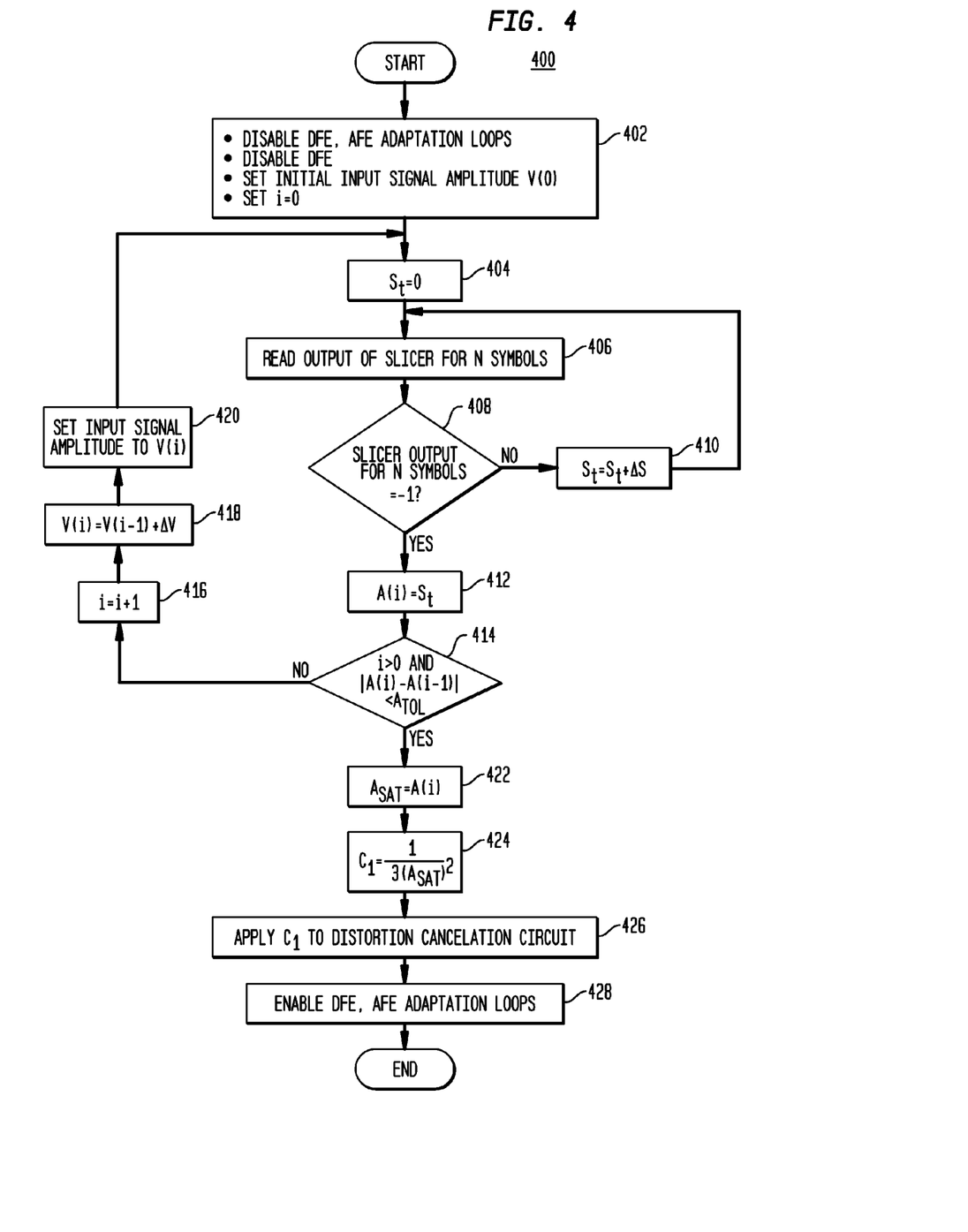
FIG. 4 is a flowchart illustrating operation of the distortion compensation circuit in a receiver of FIG. 1.

The process of FIG. 4 might be run after manufacture of the receiver 115 and the value of $C_1$ determined and fixed. This compensates for variations in manufacturing processes. Alternatively, the distortion compensation process of FIG. 4 might run each time the receiver 115 is powered up to compensate for variation in manufacturing process variation and aging. Further, the distortion compensation process might be run each time the bit error rate of the receiver reaches a certain level with the DFE and AFE adaptation loops in operation. This approach could help compensate for temperature and power supply voltage variations during use of the receiver 115.

Figure 5:
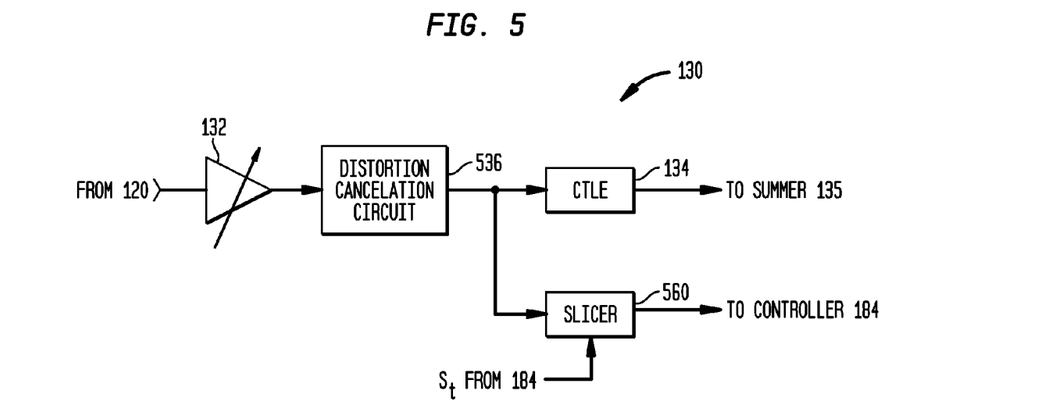
FIG. 5 is an alternative embodiment of the AFE shown in FIG. 1.

FIG. 5 diagrams the details of an alternative embodiment of the AFE 130 useful in canceling distortion generated by the variable gain amplifier (VGA) 132. In this embodiment, the VGA 132 receives input signals from the backplane 120 (FIG. 1) and the output of the VGA 132 drives a distortion compensation circuit 536 that is substantially the same as the distortion compensation circuit 136 shown in FIGS. 3 and 4. In this embodiment a slicer 560, similar to the slicer 160 (FIG. 1) described above, is used as a peak detector to detect peaks in the signal from the circuit 536. The process described in connection with FIG. 4 is used to reduce the distortion from the VGA but utilizing the slicer 560 instead of the slicer 160.

Figure 6:
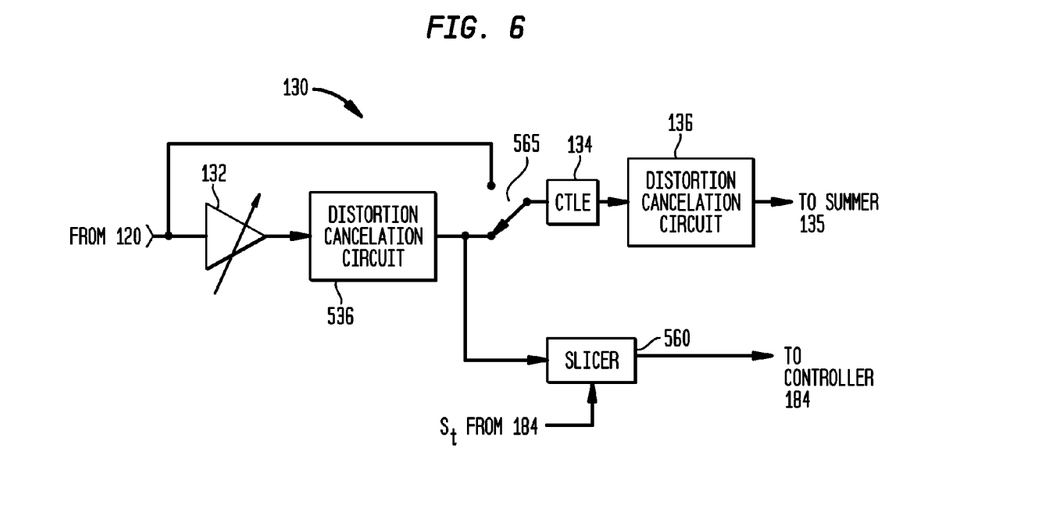
FIG. 6 is a variation of the alternative embodiment of the AFE shown in FIG. 5.

A variation of the embodiment of FIG. 5 is shown in FIG. 6 where the VGA 132 and distortion compensation circuit 536 is bypassed using a switch 565 to directly apply the input signal to the CTLE 134. Like the embodiment of FIG. 5, the slicer 560 is used as a peak detector to detect peaks in the signal from the circuit 536 and the process described in connection with FIG. 4 is used to reduce the distortion from the VGA 132. Concurrently, before, or after the process of FIG. 4 has completed for at least partially canceling distortion from the VGA 132, the process of FIG. 4 may be run but using the slicer 160, instead of slicer 560, and the distortion compensation circuit 136 to at least partially cancel distortion from the CTLE 134. The switch 565 is then configured for the CTLE 134 to receive signals processed by the circuit 536 and normal operation of the receiver 115 begins.

It is understood that the exemplary variable gain amplifier arrangement described above is useful in applications other than in SERDES receivers, e.g., communications transmitters and receivers generally. Further, while the distortion compensation circuit implemented in FIG. 4 is shown as single-ended (non-differential), in other embodiments some or all of the distortion compensation circuit can be implemented using fully differential circuitry. Still further, the embodiment in FIG. 4 is described in connection with variable transconductance amplifiers, it is also believed that the invention may be utilized in other embodiments to non-transconductance variable amplifiers. While the embodiments shown in FIGS. 3 and 4 are shown as a circuit separate from the VGA or CTLE coupled to the circuit, the distortion compensation circuit might be combined with the adjoining VGA or CTLE to form a single circuit.

While embodiments have been described with respect to circuit functions, the embodiments of the present invention are not so limited. Possible implementations, either as a stand-alone SERDES or as a SERDES embedded with other circuit functions, may be embodied in or part of a single integrated circuit, a multi-chip module, a single card, system-on-a-chip, or a multi-card circuit pack, etc. but are not limited thereto. As would be apparent to one skilled in the art, the various embodiments might also be implemented as part of a larger system. Such embodiments might be employed in conjunction with, for example, a digital signal processor, microcontroller, field-programmable gate array, application-specific integrated circuit, or general-purpose computer. It is understood that embodiments of the invention are not limited to the described embodiments, and that various other embodiments within the scope of the following claims will be apparent to those skilled in the art.

It is understood that various changes in the details, materials, and arrangements of the parts which have been described and illustrated in order to explain the nature of this invention may be made by those skilled in the art without departing from the scope of the invention as expressed in the following claims.

The invention claimed is:

1. A method of reducing distortion in an amplifier, the method comprising the steps of:
    applying an input signal, having a controllable amplitude, to the amplifier to produce an output signal;
    measuring a peak amplitude in the output signal;
    adjusting the amplitude of the input signal until a change in the measured peak amplitude is less than a threshold amount; and then
    generating an intermediate signal that is a function of the output signal;
    scaling an amplitude of the intermediate signal by a weighting factor;
    subtracting the weighted intermediate signal from the output signal to produce a compensated signal; and
    setting the weighting factor to a value related to the measured peak amplitude,
    wherein measuring the peak amplitude in the output signal comprises:
        slicing, using a threshold setting, the compensated signal to produce a binary output signal; and
        adjusting the slicer threshold setting until the output of the slicer becomes substantially the same value for a period of time,
    wherein the slice threshold setting is a saturation factor.

2. The method of claim 1 wherein the function is a cubic function.

3. The method of claim 1 wherein the amplifier is coupled to a continuous time linear equalizer in a receiver.

4. The method of claim 2 wherein the weighting factor is approximately $1/(3A^2)$, where A is the saturation factor related to the measured peak amplitude.

5. A receiver having:
    a variable gain amplifier coupled to an input of the receiver;
    a continuous time equalizer coupled between the variable gain amplifier and a node;
    a distortion compensation circuit disposed in series with the continuous time equalizer and between the variable gain amplifier and the node;
    a slicer having an input coupled to the node, an output, and a threshold setting input;
    wherein the distortion compensation circuit comprises:
    a first subtractor having a first input coupled to the variable gain amplifier, a second input, and an output coupled to the node;
    a function generator circuit having an input coupled to the first input of the first subtractor, and having an output;
    a weighting circuit, responsive to a weighting coefficient, coupled between an output of the function generator circuit and the second input of the first subtractor, wherein the function generator circuit is a cubic function and the weighting coefficient is approximately $1/(3A^2)$, where A is a saturation factor related to a peak amplitude of signals applied to the slicer;
    wherein, the function generator circuit has a transfer function with a third-power term and the weighting coefficient is set to a value that will at least partially reduce distortion in signals on the output of the distortion compensation circuit.

6. The receiver of claim 5 further representing:
    a controller responsive to the slicer output and coupled to the slicer threshold setting input;
    wherein the controller is adapted to adjust the slicer threshold setting until the output of the slicer becomes substantially the same value for a period of time, and then the saturation factor is set to slicer threshold setting.

7. The receiver of claim 6 further comprising:
    an additional distortion compensation circuit coupled between the variable gain amplifier and the equalizer; and
    an additional slicer having an output, a threshold setting, and an input coupled to the additional distortion compensation circuit;
    wherein the controller is further adapted to adjust the threshold setting of the additional distortion compensation circuit until the output of the slicer becomes substantially the same value for a period of time, and then the saturation factor is set to the slicer threshold setting of the additional slicer.

8. The receiver of claim 6, wherein the receiver further comprises:
    an error detector, coupled to the output of the slicer and the node, adapted to produce an error signal;
    a decision feedback equalizer coupled to the output of the slicer, responsive to the error signal, and having an output; and
    a second subtractor, disposed between the node and the slicer, and coupled to the output of the decision feedback equalizer;
    wherein the decision feedback equalizer is disabled by the controller when the controller is adjusting the slicer threshold setting.

9. The receiver of claim 5 wherein the controller further controls the variable gain amplifier and the controller is further adapted to adjust the gain of the variable gain amplifier to establish, in conjunction with the adjustment of the slicer threshold setting, the saturation factor.

10. The receiver of claim 5 wherein the controller is further adapted to:
    adjust the gain of the variable gain amplifier to establish, in conjunction with the adjustment of the slicer threshold setting, the saturation factor when a signal of a known amplitude is coupled to the input of the receiver.

11. The receiver of claim 5 wherein the first subtractor and the weighting circuit are implemented using transconductance amplifiers and a resistive load.

12. The receiver of claim 5 wherein the receiver is implemented using an integrated circuit.

13. The receiver of claim 5, wherein the receiver further comprises:
    an error detector.

14. The receiver of claim 5, wherein the receiver further comprises:
    a decision feedback equalizer.

15. A distortion compensation circuit having an input and an output, comprising:
    a load coupled to the output of the distortion compensation circuit;
    a first amplifier having a first gain, an input coupled to the input of the distortion compensation circuit, and an output coupled to the load;
    a function generator having an input coupled to the input of the distortion compensation circuit, and an output; and
    a second amplifier having a second gain, an input coupled to the output of the function generator, and an output coupled to the load;

an analog circuit having an output coupled to the input of the distortion compensations circuit;

wherein, the function generator has a transfer function with a third-power term, and a ratio of the gain of the second amplifier to the first amplifier is set to a value that will at least partially remove distortion from signals on the output of the distortion compensation circuit, wherein the ratio of the gain of the second amplifier to that of the first amplifier is approximately $1/(3A^2)$, where A is a saturation factor of the analog circuit.

16. The distortion compensation circuit of claim 15 wherein the first and second amplifiers are transconductance amplifiers and the load is a resistor.

17. The distortion compensation circuit of claim 15 wherein the transfer function is a cubic function.

18. The distortion compensation circuit of claim 15 wherein the distortion compensation circuit is formed in an integrated circuit.

19. The distortion compensation circuit of claim 15, wherein the first and second amplifiers are transconductance amplifiers and the load is a resistor, wherein the transfer function is a cubic function.

20. The distortion compensation circuit of claim 17 wherein the function generator comprises:

a first multiplier having inputs coupled to the input of the distortion compensation circuit; and a second multiplier having one input coupled to an output of the first multiplier, another input coupled to the input of the distortion compensation circuit, and an output coupled to the input of the second amplifier.

* * * * *